United States Patent [19]

Ogasawara

[11] Patent Number: 4,897,367

[45] Date of Patent: Jan. 30, 1990

[54] PROCESS FOR GROWING GALLIUM ARSENIDE ON SILICON SUBSTRATE

[75] Inventor: Kazuto Ogasawara, Hatano, Japan
[73] Assignee: Fujitsu Limited, Kawasaki, Japan
[21] Appl. No.: 324,880
[22] Filed: Mar. 17, 1989

[30] Foreign Application Priority Data

Mar. 18, 1988 [JP] Japan .................................. 63-063112

[51] Int. Cl.$^4$ .................... H01L 21/20; H01L 21/203
[52] U.S. Cl. ............................ 437/132; 148/DIG. 25; 148/DIG. 72; 148/DIG. 97; 148/DIG. 149; 148/38.4; 156/610; 437/107; 437/82; 437/111; 437/973; 437/976
[58] Field of Search ................. 148/DIG. 1, 3, 17, 25, 148/56, 59, 65, 72, 97, 110, 149, 160, 169, 33-33.4; 156/610-615; 427/248.1, 252; 357/16, 17; 437/81, 82, 101, 105, 107, 108-109, 110, 111, 126, 132, 247, 939, 946, 973, 976

[56] References Cited

U.S. PATENT DOCUMENTS

| | | | |
|---|---|---|---|
| 3,935,040 | 1/1976 | Mason ................................. | 156/610 |
| 4,120,706 | 10/1978 | Mason ................................. | 437/132 |
| 4,159,214 | 6/1979 | Mason ................................. | 437/132 |
| 4,392,297 | 7/1983 | Little ................................... | 437/132 |
| 4,551,394 | 11/1985 | Betsch et al. ..................... | 148/33.4 |
| 4,632,712 | 12/1986 | Fan et al. ........................... | 437/132 |
| 4,657,603 | 4/1987 | Kruehler et al. .................. | 437/132 |

FOREIGN PATENT DOCUMENTS

| | | | |
|---|---|---|---|
| 0052126 | 3/1982 | Japan ................................. | 437/132 |
| 61-94318 | 5/1986 | Japan . | |
| 0105832 | 5/1986 | Japan ................................. | 437/132 |
| 61-105832 | 5/1986 | Japan . | |
| 61-107719 | 5/1986 | Japan . | |
| 61-107721 | 5/1986 | Japan . | |
| 61-145820 | 7/1986 | Japan . | |
| 2098614 | 5/1987 | Japan ................................. | 437/132 |
| 0014418 | 1/1988 | Japan ................................. | 437/132 |

OTHER PUBLICATIONS

Morkoc et al., "Gallium Arsenidean Silicon: A Review", Solid State Tech., Mar. 1988, pp. 71-75.
Varrio et al.,, "New Approach to Growth of High-Quality Gats Layers on Si substrates", Appl. Phys. Lett. vol. 51 No. 22, 30 Nov. 1987, pp. 1801-3.
Chang et al., "Growth of High Quality Gats Layers Direction Si Substrate . . . ", J. Vac. Sci. Technol., vol. 5, No. 3, May–Jun. 1987, pp. 815-8.
Ogasawara et al., "Stress-Released MBE Growth of GaAs on Si(001) with a Si-GaAs Superlattice Buffer," Jpn. J. Appl. Phys., Part 2 (Letters); vol. 28, No. 1, Jan. 1989, pp. L10-L12.
S. Yokoyama et al., "Low Temperature Growth of GaAs on Si by Migration Enhanced Molecular Beam Epitaxy", Extended Abstracts of the 19th Conference on Solid State Devices and Materials, Tokyo, 1987, pp. 147-150.
K. Ishida et al., Japanese Journal of Applied Physics vol. 26, No. 5, May, 1987, pp. L530-L532.
T. Soga et al., Japanese Journal of Applied Physics vol. 26, No. 5, May, 1987, pp. L536-538.
T. Soga et al., Journal of Crystal Growth 77(1986) pp. 498-502.
M. Akiyama et al., Journal of Crystal Growth 68(1984) pp. 21-26.

*Primary Examiner*—Brian E. Hearn
*Assistant Examiner*—William Bunch
*Attorney, Agent, or Firm*—Armstrong, Nikaido, Marmelstein, Kubovcik & Murray

[57] ABSTRACT

A GaAs layer having a high crystallinity can be grown over an Si substrate without warping, by process for growing a GaAs layer on an Si substrate, said process comprising: forming a first GaAs layer in the amorphous state on the Si substrate at a first temperature, the first GaAs layer being formed with a thickness allowing formation of a single crystalline layer having a thickness of one to three monomolecular layers; heating the first GaAs layer to change the amorphous state of the first GaAs layer to a single crystalline state; forming an Si layer on the first GaAs layer at a second temperature higher than the first temperature, the Si layer being formed with a thickness having one to six monoatomic layers; forming a second GaAs layer in the amorphous state on the Si layer at the first temperature, the second GaAs layer being formed with a thickness substantially the same as the thickness of the first GaAs layer; heating the second GaAs layer the change the amorphous state of the second GaAs layer to a single crystalline state; and epitaxially growing a third GaAs layer on the second GaAs layer.

12 Claims, 3 Drawing Sheets

PROCESS FOR GROWING GALLIUM ARSENIDE ON SILICON SUBSTRATE

BACKGROUND OF THE INVENTION

1. Field of the Invention

The present invention relates to a process for growing gallium arsenide (GaAs) on a silicon (Si) substrate.

2. Description of the Related Art

Gallium arsenide has a high carrier mobility, and thus is very useful for semiconductor devices. However, a GaAs layer is grown on a GaAs substrate, and it is difficult to manufacture GaAs substrates having a large diameter, which is disadvantageous with regard to through-put, and therefore there is a need to develop a technique of growing a GaAs layer on an Si substrate. This, however, leads to the problems of a large lattice mismatch, a difference of the thermal expansion coefficients of GaAs and Si, and the existence of an antiphase domain.

The problem of the presence of an antiphase domain can be solved by using offset-angle substrates, but the problems relating to warping of the substrate due to the different thermal expansion coefficients of GaAs and Si remain unsolved.

In an effort to reduce warping, it has been proposed to grow a GaAs layer on an Si substrate using a buffer layer of GaP to GaAsP to GaAs in which the lattice constant is changed from that of GaP or Si to that of GaA, through intermediate lattice constant thereof. This process, however, requires a high temperature metal organic chemical vapor deposition (MOCVD) and presents difficulties when using molecular beam epitaxy (MBE).

Therefore, an object of the present invention is to provide a GaAs layer grown on an Si substrate and a process for growing a GaAs layer on an Si substrate, whereby an excellent quality GaAs layer free of warping is formed.

SUMMARY OF THE INVENTION

The above and other objects of the present invention are obtained by providing process for growing a GaAs layer on an Si substrate, said process comprising: forming a first GaAs layer in the amorphous state on the Si substrate at a first temperature, the first GaAs layer being formed with a thickness allowing formation of a single crystalline layer having a thickness of one to three monomolecular layers; heating the first GaAs layer to change the amorphous state of the first GaAs layer to a single crystalline state; forming an Si layer on the first GaAs layer at a second temperature higher than the first temperature, the Si layer being formed with a thickness having one to six monoatomic layers; forming a second GaAs layer in the amorphous state on the Si layer at the first temperature, the second GaAs layer being formed with a thickness substantially the same as the thickness of the first GaAs layer; heating the second GaAs layer to change the amorphous state of the second GaAs layer to a single crystalline state; and epitaxially growing a third GaAs layer on the second GaAs layer.

Preferably the third GaAs layer is formed at a temperature of 200° C. to 400° C., preferably with a thickness of not less than 100 Å, more preferably 100 Å to 200 Å. A fourth GaAs layer can be grown on the third GaAs layer at a temperature of 450° C. to 580° C.

DESCRIPTION OF THE PREFERRED EMBODIMENTS

Figure 1:
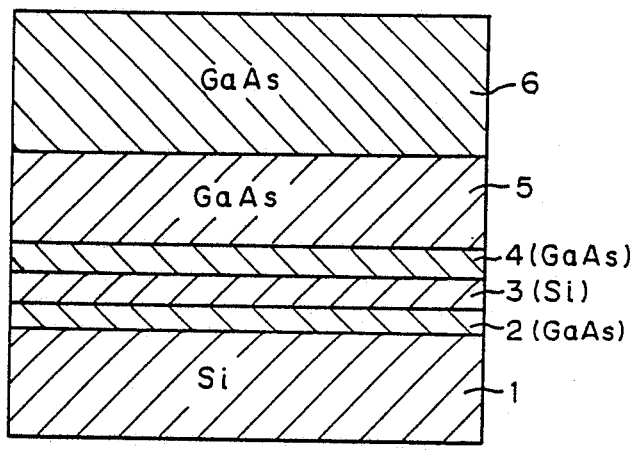
FIG. 1 illustrates an example of a GaAs layer grown over an Si substrate according to the present invention.

FIG. 1 schematically shows an example of the present invention, wherein 1 denotes an Si substrate 2 inches in diameter and 300 tm thick and oriented within ±1° from the (001) plane. The direction of the plane of the Si substrate is not limited in the present invention. Theoretically, the offset angle should preferably be 0° or 0.2° to 3°, but may be within 0.2° since most practical substrates have a sufficient offset angle. The substrate having such an offset angle may have steps on the surface, the steps having a height corresponding to the height of the bi-atomic layer of silicon. The height of the steps, if any, on the surface of the Si substrate should correspond to the height of the bi-atomic layer of the silicon, since a thickness of a GaAs monomolecular layer corresponds to the height or thickness of the bi-atomic layer of silicon. These steps can be filled by a GaAs monomolecular layer so that the Si layer is not exposed after the first GaAs monomolecular layer is formed on the Si substrate. If the steps have a height corresponding to only a monoatomic layer of silicon, the GaAs monomolecular layer formed thereon has a layer including Ga and As, which may cause the appearance of antiphase domains of a GaAs layer formed thereover. The Si substrate is heat treated or surface cleaned in an MBE system under a high vacuum, for example, $10^{-9}$ Torr at a temperature of about 1000° C. for about 20 minutes.

Next, while opening an As cell shutter or irradiating an As beam onto the substrate 1, the temperature of the substrate 1 is decreased to 60°–90° C. over a period of about 20 minutes and then a Ga cell shutter is opened or a Ga beam is irradiated onto the substrate 1 in an amount needed to form a GaAs layer (for about 1 second), and thus the first GaAs layer 2 is formed. The thickness of this GaAs layer 2 is a thickness that forms a GaAs monomolecular layer when single crystallined in the later step. In this step, reflection high-energy electron diffraction (RHEED) intensity oscillation is used to monitor the amount of the Ga beam irradiated. This formation of the GaAs layer 2 should be conducted at a low temperature of 60°–90° C. If the temperature is higher than 90° C., the GaAs is formed as islands due to migration. By depositing GaAs at 60°–90° C., GaAs is not formed as islands and is uniformly formed in the amorphous state entirely on the Si. Note that As, which is continuously irradiated, is not deposited on the substrate if Ga is not copresent.

While still irradiating an As beam on the substrate, the temperature of the substrate 1 is increased to 200°–400° C., at which a solid phase growth of GaAS can be obtained, over a period of about 20 minutes. Namely, heating results in change of the amorphous GaAs layer 2 on the single crystal Si substrate 1 to a single crystal GaAs layer by using the single crystal Si as seeds. Incidentally, the As beam is irradiated to prevent out-diffusion of As from the GaAs layer 2 when heated.

Then, the As beam is stopped and an Si beam is irradiated in an amount needed to form an Si bi-atomic layer (for about 10–30 seconds), and thus an Si bi-atomic layer 3 is formed on the first GaAs layer 2. The amount of the Si beam is monitored by a RHEED intensity oscillation.

An As beam is again irradiated while the temperature of the substrate 1 is decreased to 60°–90° C. over a period of about 20 minutes. Irradiation of the As beam is continued and a Ga beam is irradiated in an amount needed to form a GaAs monomolecular layer, while monitoring the Ga beam with a RHEED intensity oscillation, and thus a second GaAs layer 4 is formed. The thus formed second GaAs layer 4 is in the amorphous state and is not formed in the form of islands due to low temperature deposition. The thickness of the second GaAs layer 4 is preferably the same as that of the first GaAs layer 2 in the form of amorphous.

The second GaAs layer 4 is changed from the amorphous state to the single crystalline state by the following heating step, i.e., heating to 200°–400° C. while irradiating an As beam.

The thus-obtained structure of the GaAs-Si-GaAs acts to absorb warping caused by the different thermal expansion coefficients of the Si of the Si substrate and the GaAs of a GaAs layer formed on this structure. The present invention is not limited to a particular theory, but it is considered that the flexibility of the constituent layers of this structure due to the thin thickness of the constituent layers contributes to the above absorption of warping.

Next, while irradiating the As beam, the substrate 1 is heated to 200°–400° C. over a period of about 20 minutes and the Ga beam is irradiated intermittently in an amount needed to form a GaAs monomolecular layer (for about 1 second) at 1 minute intervals a plurality of times (about 100 times), to form a laminate of GaAs monomolecular layers 5. This laminate 5 is formed at a temperature of 200°–400° C., since if the temperature is higher than 400° C., the structure of the GaAs layer 2, the Si layer 3 and the GaAs layer 4 is destroyed. The laminate 5 of GaAs monomolecular layers acts a buffer layer to allow a GaAs layer 6 to be epitaxially grown thereon at 450° C. to 580° C.

The single crystal GaA layer 6 is epitaxially grown on the GaAs layer 5 at a temperature of 450° C. to 580° C. A temperature of at least 450° C. is necessary for a higher quality epitaxial layer of GaAs, but a temperature higher than 580° C. will cause warping of the resultant GaA layer 6 on the substrate. The formation of the GaAs layer 6 is conducted by continuously irradiating As and Ga beams onto the substrate after the substrate is heated to about 450° C.–580° C. over a period of about 1 hour. The thickness of the GaAs layer 6 is not limited.

After the GaAs layer 6 is formed, the substrate 1 is cooled to room temperature over a period of about 60 minute while irradiating the As beam.

Figure 2:
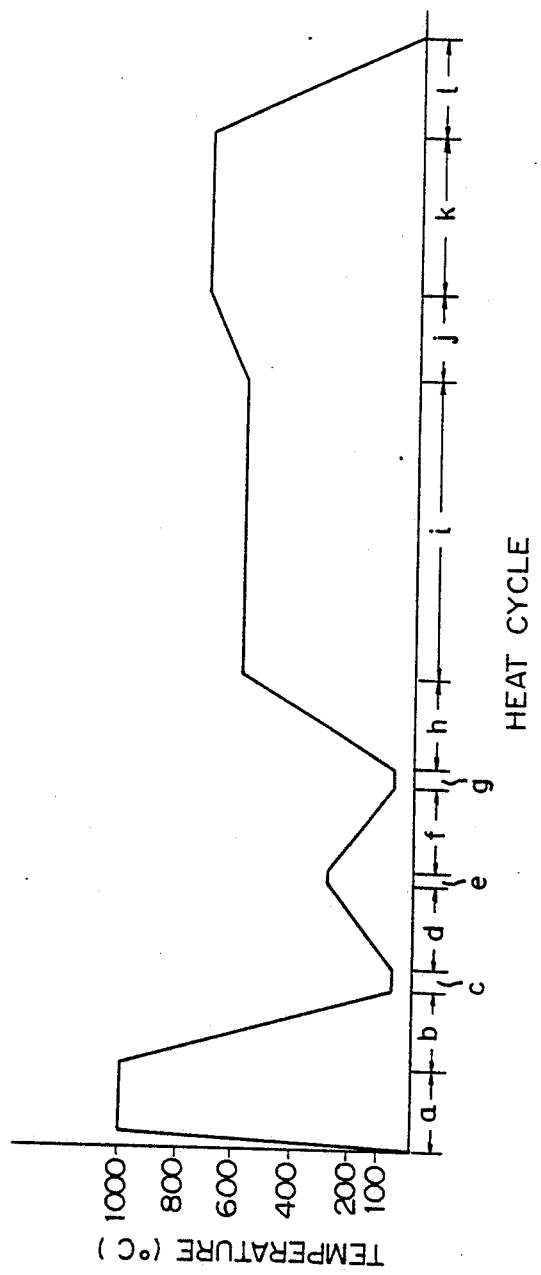
FIG. 2 shows a heat cycle pattern for growing the GaAs layer over the Si substrate as in FIG. 1.

The heating cycle of the above process for growing a GaAs layer on an Si substrate is illustrated in FIG. 2, in which the Si substrate 1 is surface cleaned in step (a), the GaAs layer 2 is grown in step (c), the Si layer 3 is grown in step (e), the GaAs layer 4 is grown in step (g), the GaAs layer 5 is grown in step (i), and the GaAs layer 6 is grown in step (k).

The thus-obtained GaAs layer 6 on the Si substrate 1 has an excellent crystal quality and is not warped.

Note, it is possible to epitaxially grow a layer of $Al_xGa_{1-x}As$ ($0 \leq x \leq 0.3$) on the GaAs layer.

Figure 3:
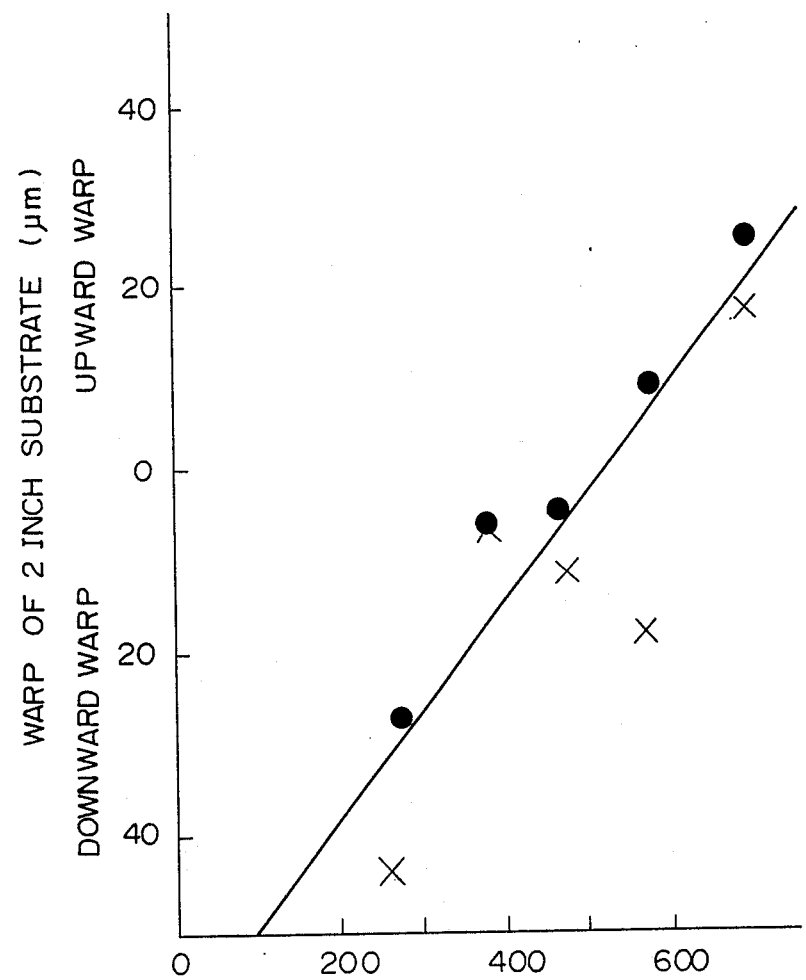
FIG. 3 shows the warping of the GaAs layer grown on the Si substrate when grown at various temperatures.

The above optimum temperature range of 450° C. to 580° C. for the epitaxial growth of a GaAs layer 6 was determined by the following experiments. The layers 2 to 5 were formed on the Si substrate 1 in the same manner as in the above example, and then the GaAs layer 6 was grown at various temperatures, followed by measuring resultant warping after cooling the substrate 1 to room temperature. The results are summarized in FIG. 3, in which the solid circles show the warping. From FIG. 3, it can be seen that the warping is within 10 tm if the temperature is from 450° C. to 580° C. Note, the amount of warping is calculated from the lattice constants of the measured layers. The lattice constant measurement results are also shown in FIG. 3 as x, and these results correspond closely to the warping results.

Note that the steps of forming the first GaAs layer 2, the Si layer 3 and the second GaAs layer 4 may be repeated a plurality of times, e.g., two to three times before forming a third GaAs layer 5. According to the present invention, the first and second GaAs layers 2 and 4 have a thickness having one to three monomolecular layers and the Si layer 3 has a thickness corresponding to that thickness, one to six monoatomic layers, preferably even number of monoatomic layers within which thickness the difference of the lattice constants of Si and GaAs can be absorbed.

What is claimed:

1. A process for growing a GaAs layer on an Si substrate, said process comprising:
    forming a first GaAs layer in the amorphous state on the Si substrate at a first temperature, the first GaAs layer being formed with a thickness allowing formation of a single crystalline layer having a thickness of one to three monomolecular layers;
    heating the first GaAs layer to change the amorphous state of the first GaAs layer to a single crystalline state;
    forming an Si layer on the first GaAs layer at a second temperature higher than the first temperature, the Si layer being formed with a thickness having one to six monoatomic layers;
    forming a second GaAs layer in the amorphous state on the Si layer at the first temperature, the second GaAs layer being formed with a thickness substantially the same as the thickness of the first GaAs layer;
    heating the second GaAs layer to change the amorphous state of the second GaAs layer to a single crystalline state; and
    epitaxially growing a third GaAs layer on the second GaAs layer.

2. A process according to claim 1, wherein the first temperature is in a range of 60° C. to 90° C.

3. A process according to claim 1, wherein the second temperature is in a range of 200° C. to 400° C.

4. A process according to claim 1, wherein said first and second GaAs layers in the amorphous state are heated to a temperature in a range of 200° C. to 400° C. to change the amorphous state to the single crystalline state.

5. A process according to claim 1, wherein said third GaAs layer is grown at a temperature of 200° C. to 400° C.

6. A process according to claim 1, wherein the first and second GaAs layers have a thickness of monomolecular layer when crystallized and the Si layer has a thickness of two monoatomic layers.

7. A process according to claim 1, wherein the Si substrate has a (100) plane surface with an offset angle of less than ±3°.

8. A process according to claim 1, wherein the Si substrate is heat treated at a temperature of 1000° C. to 1300° C. before the first GaAs layer is formed thereon.

9. A process according to claim 1, further forming fourth GaAs layer on the third GaAs layer at a temperature of 450° C. to 580° C.

10. A process according to claim 9, wherein the third GaAs layer is formed to have a thickness of not less than 100 Å.

11. A process according to claim 10, wherein the third GaAs layer is formed to have a thickness of 100 Å to 200 Å.

12. A process according to claim 1, wherein the first to third GaAs layers and the Si layer are formed by a molecular beam epitaxy system.

* * * * *